(12) United States Patent
Yen

(10) Patent No.: US 10,581,400 B2
(45) Date of Patent: Mar. 3, 2020

(54) ACOUSTIC WAVE RESONATORS HAVING FRESNEL SURFACES

(71) Applicant: Texas Instruments Incorporated, Dallas, TX (US)

(72) Inventor: Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/639,478

(22) Filed: Jun. 30, 2017

(65) Prior Publication Data

US 2019/0007023 A1  Jan. 3, 2019

(51) Int. Cl.
*H03H 9/02* (2006.01)
*H03H 9/25* (2006.01)
*H03H 9/00* (2006.01)

(52) U.S. Cl.
CPC ...... *H03H 9/02677* (2013.01); *H03H 9/0009* (2013.01); *H03H 9/02543* (2013.01); *H03H 9/02574* (2013.01); *H03H 9/02629* (2013.01); *H03H 9/25* (2013.01)

(58) Field of Classification Search
CPC ... H03H 9/02; H03H 9/02007; H03H 9/02535
See application file for complete search history.

(56) References Cited

U.S. PATENT DOCUMENTS

| | | | |
|---|---|---|---|
| 4,188,557 A | 2/1980 | Mattuschka | |
| 4,193,473 A * | 3/1980 | Hartemann | G10K 11/36 181/176 |
| 4,985,655 A | 1/1991 | Jensik et al. | |
| 6,087,198 A | 7/2000 | Panasik | |
| 6,548,942 B1 | 4/2003 | Panasik | |
| 6,842,088 B2 * | 1/2005 | Yamada | B06B 1/0644 310/322 |
| 7,067,964 B1 | 6/2006 | Kosinski | |
| 7,418,772 B2 * | 9/2008 | Nishiyama | H03H 3/10 29/25.35 |
| 7,621,624 B2 * | 11/2009 | Pan | B41J 2/14008 347/46 |
| 7,675,389 B2 * | 3/2010 | Yamakawa | H03H 3/04 310/312 |
| 7,714,684 B2 * | 5/2010 | Ruby | H03H 3/02 310/322 |
| 7,786,826 B2 * | 8/2010 | Thalhammer | H03H 9/0004 310/334 |
| 7,893,597 B2 * | 2/2011 | Nishimura | H03H 9/14541 310/313 B |

(Continued)

OTHER PUBLICATIONS

C.J. Wilson, "Vibration modes of AT-cut convex quartz resonators," J. Phys. D: Appl. Phys., vol. 7, 1974, 7 pages.

(Continued)

*Primary Examiner* — Dean O Takaoka
*Assistant Examiner* — Alan Wong
(74) *Attorney, Agent, or Firm* — Michael A. Davis, Jr.; Charles A. Brill; Frank D. Cimino

(57) ABSTRACT

Acoustic wave resonators having Fresnel features are disclosed. An example integrated circuit package includes an acoustic wave resonator, the acoustic wave resonator including a Fresnel surface. In some examples, the Fresnel surface includes a plurality of recessed features and/or protruding features at different locations on the Fresnel surface, each of the plurality of features to confine main mode acoustic energy from a respective portion of the Fresnel surface in a central portion of the acoustic wave resonator.

9 Claims, 2 Drawing Sheets

(56) References Cited

U.S. PATENT DOCUMENTS

| | | | |
|---|---|---|---|
| 7,939,987 B1 | 5/2011 | Solal et al. | |
| 8,215,171 B1 | 7/2012 | Smith et al. | |
| 8,456,257 B1 | 6/2013 | Fattinger | |
| 8,941,286 B2 | 1/2015 | Ortiz et al. | |
| 9,232,289 B2 | 1/2016 | Bahr et al. | |
| 9,577,603 B2* | 2/2017 | Burak | H03H 9/175 |
| 9,663,346 B1 | 5/2017 | Bahr et al. | |
| 9,673,376 B1 | 6/2017 | Krivokapic et al. | |
| 9,876,483 B2 | 1/2018 | Ortiz et al. | |
| 2004/0070313 A1* | 4/2004 | Furukawa | H03H 9/02661 |
| | | | 310/313 R |
| 2005/0093656 A1 | 5/2005 | Larson, III et al. | |
| 2006/0255696 A1 | 11/2006 | Sato | |
| 2009/0295505 A1 | 12/2009 | Mohammadi et al. | |
| 2013/0214879 A1 | 8/2013 | Gorisse et al. | |
| 2014/0273881 A1 | 9/2014 | Tajic | |

OTHER PUBLICATIONS

Adachi et al., "Investigation of Spurious Modes of Convex DT-Cut Quartz Crystal Resonators," Proc. 35th Annual Freq Control Symposium, USAERADCOM, Ft. Monmouth, NJ, May 1981, 8 pages.

Bahr et al., "Theory and Design of Phononic Crystals for Unreleased CMOS-MEMS Resonant Body Transistors," Journal of Microelectromechanical Systems, vol. 24, No. 5, Oct. 2015, 14 pages.

Bahr, "Monolithically Integrated MEMS Resonators and Oscillators in Standard IC Technology," Doctoral Thesis, Massachusetts Institute of Technology, May 18, 2016, 255 pages.

Bahr et al., "Vertical Acoustic Confinement for High-Q Fully-Differential CMOS-RBTS," Solid-State Sensors, Actuators and Microsystems Workshop, Hilton Head), 2016, 4 pages.

Bahr et al., "Optimization of Unreleased CMOS-MEMS RBTs," Frequency Control Symposium (IFCS), 2016 IEEE International, 4 pages.

Wang et al., "Tapered Phononic Crystal Saw Resonator in GAN," MEMS 2015, Estoril, Portugal, Jan. 18-22, 2015, IEEE, 4 pages.

Wang et al., "Resonant Body Transistors in Standard CMOS Technology," Oct. 2012, 7 pages.

Gorishnyy et al., "Sound ideas," Physics World, Dec. 2005, 6 pages.

Lin et al., "Quality Factor Enhancement in Lamb Wave Resonators Utilizing Aln Plates with Convex Edges," IEEE, Trasducers '11, Beijing, China, Jun. 5-9, 2011, 4 pages.

International Search Report for PCT/US2018/043612 dated Oct. 18, 2018.

* cited by examiner

US 10,581,400 B2

ACOUSTIC WAVE RESONATORS HAVING FRESNEL SURFACES

FIELD OF THE DISCLOSURE

This disclosure relates generally to acoustic wave resonators, and, more particularly, to acoustic wave resonators having Fresnel surfaces.

BACKGROUND

In acoustic wave resonators (e.g., bulk acoustic wave (BAW) resonators, surface acoustic wave (SAW) resonators, plane acoustic wave (PAW), etc.), electrodes (e.g., contacts, metal patches, etc.) excite acoustic waves in piezoelectric material. The acoustic waves of specific frequencies are generated within a resonant cavity forming an electrical resonant response.

SUMMARY

Acoustic wave resonators having Fresnel features are disclosed. An example integrated circuit package includes an acoustic wave resonator, the acoustic wave resonator including a Fresnel surface. In some examples, the Fresnel surface includes a plurality of recessed features and/or protruding features at different locations on the Fresnel surface, each of the plurality of features to confine main mode acoustic energy from a respective portion of the Fresnel surface in a central portion of the acoustic wave resonator.

Figure 1:
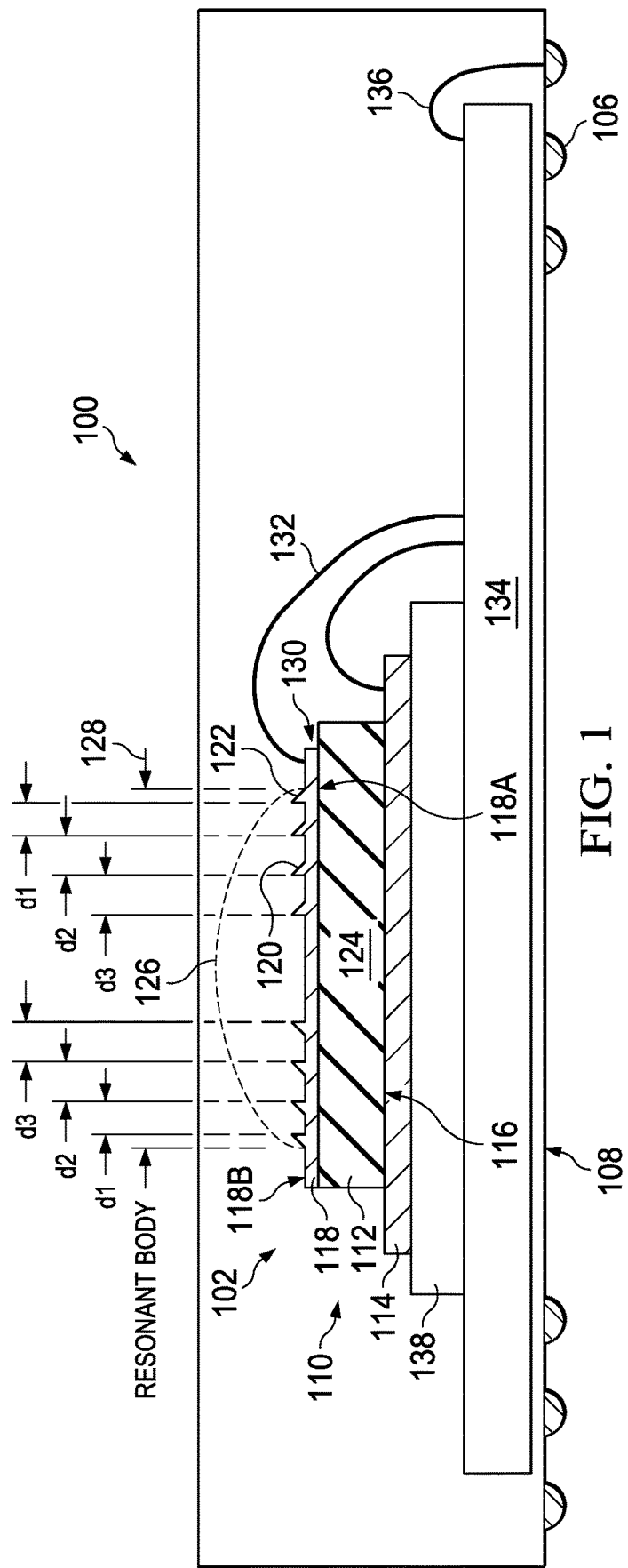
FIG. 1 is a side cross-section view of an example integrated circuit (IC) package including an example bulk acoustic wave (BAW) resonator having a Fresnel electrode, constructed according to this disclosure, mounted on an IC die.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Use of terms such as up, down, top, bottom, side, end, front, back, etc. herein are used with reference to a currently considered or illustrated orientation. If a different orientation is considered, it should be understood that such terms must be correspondingly modified. Connecting lines or connectors shown in the various figures presented are intended to represent example functional relationships and/or physical or logical couplings between the various elements.

DETAILED DESCRIPTION

Reference will now be made in detail to non-limiting examples of this disclosure, which are illustrated in the accompanying drawings. The examples are described below by referring to the drawings.

The performance of devices, such as modern wireless communication devices, depends heavily on the accuracy and noise level of the clock signals used in a system. Such systems necessarily need high-frequency, and high quality factor (Q) resonators. Q is a dimensionless parameter that reflects the under-damping of an oscillator, and characterizes a resonator's bandwidth relative to its center frequency. The Q of known acoustic wave resonators are 10 to 100 times lower than the intrinsic limitations of the piezoelectric material. To improve the performance of acoustic wave resonators, example acoustic wave resonators including Fresnel features on surfaces (e.g., a top surface, a bottom surface, a side surface, an end surface, an edge surface, an edge, etc.) of the resonator) are disclosed herein. Because disclosed example Fresnel features are patterned analogous to a Fresnel lens, the Fresnel features implement, in effect, convex curved surfaces that retain more acoustic energy in the resonator. The increase in retained acoustic energy increases the Q of the acoustic wave resonator (e.g., by a factor of two or higher), and, in turn, the performance of a system including this device.

References made herein to a Fresnel surface (which may be on, for example, a top surface, a bottom surface, a side surface, an end surface, an edge surface, an edge, etc.), or similar, refer to a surface (e.g., a top surface, a bottom surface, a side surface, an end surface, an edge surface, an edge, etc.) having a Fresnel-based pattern, at least in part, based on concepts or principles of a Fresnel lens. Example Fresnel surfaces have an arrangement of spaced-apart, recessed features, and/or raised features and/or protrusions that each, like the features of a Fresnel lens, confine (e.g., by directing or reflecting) energy toward a central portion of an acoustic wave resonator. Example Fresnel surfaces include an electrode having a Fresnel surface (i.e., a Fresnel electrode), piezoelectric material having a Fresnel surface, e.g., on an edge, (i.e., Fresnel piezoelectric material), etc. In some examples, the arrangement of features of a Fresnel surface may be simplified to reduce manufacturing complexity, based on manufacturing constraints, to reduce manufacturing cost, to meet performance constraints and/or design constraints, etc. As described, the example Fresnel surfaces disclosed herein can be formed using known or future patterning processing steps compatible with complementary metal-oxide semiconductor (CMOS) manufacturing processes.

FIG. 1 is a side cross-section view of an example IC package 100 having an example BAW resonator 102 disposed in the example IC package 100. The example IC package 100 of FIG. 1 is a surface mount device with a plurality of contacts (an example of which is designated at reference numeral 106) on a bottom side 108. However, the example IC package 100 may be of any type, and may have any form, material(s), shape, dimension(s), number of contacts, shape of contacts, etc. Moreover, the BAW resonator 102 and/or any other components may be integrated, etc. with other active ICs (e.g., an example IC 134) and/or passive components, or by itself in and packaged in an IC package (e.g., the IC package 100) in any way. The example IC 100 may be, for example, a semiconductor-based device. In some examples, the IC package 100 is a wafer-level package, or a die-level package.

The example BAW resonator 102 of FIG. 1 includes a layer 110 of piezoelectric material 112 disposed on (e.g., deposited on, formed on, etc.) an example bottom electrode 114. While in the illustrated example of FIG. 1, at least a portion of a bottom surface 116 of the layer 110 of piezoelectric material 112 that is in contact with the electrode 114 is a plane surface, and the electrode 114 is a plane structure, they may be formed to have other shapes. In the case of a semiconductor-based IC package, the example piezoelectric material 112 may include a piezoelectric thin film layer compatible with a semiconductor fabrication process, such as aluminum nitride, zinc oxide, etc. In some examples, the BAW resonator 102 is built on a released substrate or a sacrificial layer to form a free-standing thin-film resonator. In other examples, the BAW resonator 102 is built on one or more acoustic reflectors (Bragg reflectors) to form a solidly mounted resonator.

A Fresnel surface in the form of an example top Fresnel electrode 118 is disposed on (e.g., formed on, deposited on, etc.), at least part of, the layer 110 of piezoelectric material 112. As shown, the electrode 114 and the Fresnel electrode 118 need not have the same dimensions as the layer 110 of piezoelectric material 112, or each other, and may have different dimensions in different directions. In the example of FIG. 1, the Fresnel electrode 118 has a first surface 118A facing the layer 110 of piezoelectric material 112, and a second surface 118B opposite the first surface 118A.

Fresnel lenses take advantage of the fact that light rays are only deviated at the surface of a medium (e.g., a lens). A Fresnel lens replaces the curved surface of a conventional lens with a series of concentric grooves. The grooves implement individual refracting surfaces, which bend light to a common focal length. As a result, the bulk of the material in the center of a lens that serves only to increase the amount of weight and absorption within the system can be reduced or eliminated.

To increase retention of acoustic energy in the layer 110 of piezoelectric material 112, the surface 118B of the example Fresnel electrode 118 is patterned to have a plurality of spaced-apart (e.g., at different locations), recessed features, and/or raised and/or protruding features, one of which is designated at reference numeral 120. The example features 120 of FIG. 1 are shaped and positioned according to (e.g., using, based on, etc.) principles or concepts from Fresnel lenses. Similar to (e.g., analogous to, same as, etc.) a Fresnel lens, each of the example features 120 of FIG. 1 has a sloped surface (one of which is designated at reference numeral 122) that reflects acoustic energy from a respective, different portion of the Fresnel electrode 118 toward a central portion 124 of the layer 110 of piezoelectric material 112. In some examples, the features 120 are spaced apart by steadily changing distances. However, the features 120 may be arranged in other ways. While example features 120 are shown in FIG. 1, features have different shapes and/or dimensions may be used. For example, may include a curved edge, a straight edge, a triangular shape, a rectangular shape, or a stair-stepped shape. Example alternative features are discussed below in connection with FIGS. 2 and 3. The features 120 implement individual refracting surfaces that direct acoustic energy to the central portion 124, thus, in effect, collectively implement a virtual convex surface 126. The virtual convex electrode 126, at least in part, reduces spurious modes, and confines main mode acoustic energy in a resonant cavity portion 128 of the BAW resonator 102. By confining the acoustic energy in the resonant cavity portion 128, less acoustic energy leaks out from the BAW resonator 102, thereby increasing the quality factor Q of the acoustic wave resonator 102, and, in turn, the performance of a system including the example BAW 102 and/or the example IC package 100. In the case of a semiconductor-based IC package, the example electrodes 114 and 118 are formed of a conductive material compatible with a semiconductor fabrication process. The Fresnel electrode 118 and the features 120 may be patterned (e.g., deposited, formed, etched, constructed, etc.) using any number and/or type(s) of known and future manufacturing processes, such as grayscale lithography, sloped lithography technique, etc. In some examples, the Fresnel electrode 118 does not extend to one or both ends of the layer 110 of piezoelectric material 112 (as shown at reference numeral 130) to prevent (e.g., reduce, etc.) acoustic energy leakage at the end of the layer 110 of piezoelectric material 112.

The shape of the virtual convex electrode 126 will vary with the shape(s) of the features 120 and/or their locations. In some examples, the features 120 have the same shape, and are spaced apart by steadily changing distances, as shown in FIG. 1. For instance, a first pair of features is separated by a first distance d1, a second pair of features is separated by a second distance d2 greater than the first distance d1, a third pair of features is separated by a third distance d3 greater than the second distance d2, etc. In some examples, the pattern of the features 120 is symmetric in one or more dimensions. In some examples, the shape(s), separation(s), and/or locations of the features 120 are determined using first principles, mathematics, simulation, trial-and-error, laboratory experiments, etc.

The electrode 114 and the Fresnel electrode 118 may be electrically coupled with other components in the IC package 100 and/or external components. For example, the electrode 114, and the Fresnel electrode 118 may be electrically coupled (shown conceptionally by bond wires 132 in FIG. 1) to the example IC 134 (e.g., a digital logic circuit, an analog circuit, a processor core, a digital signal processor (DSP) core, etc.) implemented in the IC 100. In some examples, the IC 134 controls and/or uses a clock signal generated using the BAW resonator 102 to perform one or more functions (e.g., down conversion, up conversion, modulation, de-modulation, etc.). In some examples, the BAW resonator 102 is coupled with other BAW resonators of different sizes to form a filtering function. The IC 134, the electrode 114 and/or the Fresnel electrode 118 may be electrically coupled to an external contact 106, as shown conceptually in FIG. 1 with a bone wire 136. In the example of FIG. 1, the electrode 114 is disposed on (e.g., deposited, formed on, etc.) an example substrate 138, an acoustic reflector, a sacrificial layer, etc. In some examples, the IC 134 is an IC die, and the BAW resonator 102 is a microelectromechanical system (MEMS) die.

In operation, when a voltage is applied between the top Fresnel electrode 118 and the bottom electrode 114, bulk acoustic waves of specific frequencies are generated, forming a resonance response. The resonant response may, for example, be used to generate a clock signal, a carrier signal, etc.

While an example manner of implementing the IC package 100 including a BAW resonator 102 having a Fresnel electrode 118 in accordance with this disclosure is illustrated in FIG. 1, one or more of the parts illustrated in FIG. 1 may be combined, divided, re-arranged, omitted, eliminated and/ or implemented in any other way. Further, an IC package including a BAW resonator having a Fresnel electrode in accordance with this disclosure may include one or more parts in addition to, and/or instead of, those illustrated in FIG. 1, and/or may include more than one of any or all of the illustrated parts. For example, acoustic reflectors may be included.

Figure 2:
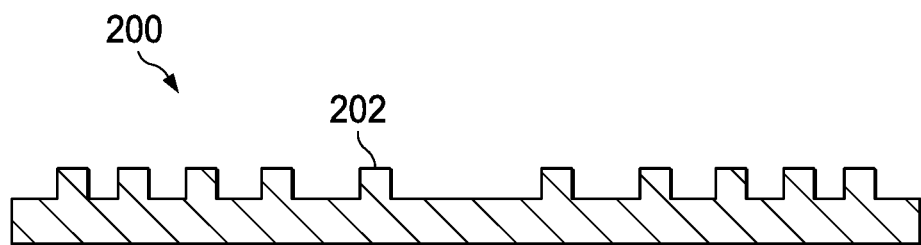
FIG. 2 is a side cross-section view of another example Fresnel electrode that may be used to implement the example acoustic wave resonator of FIG. 1.

FIG. 2 is a side cross-section view of another example Fresnel electrode 200, in accordance with this disclosure. In the example FIG. 2, the features 120 having the sloped surfaces 122 are replaced with features (one of which is designated at reference numeral 202) having rectangular shapes. Like FIG. 1, the features 202 of FIG. 2 are spaced apart by steadily changing distances. However, the features 202 may be arranged in other ways, and/or may have other dimensions.

Figure 3:
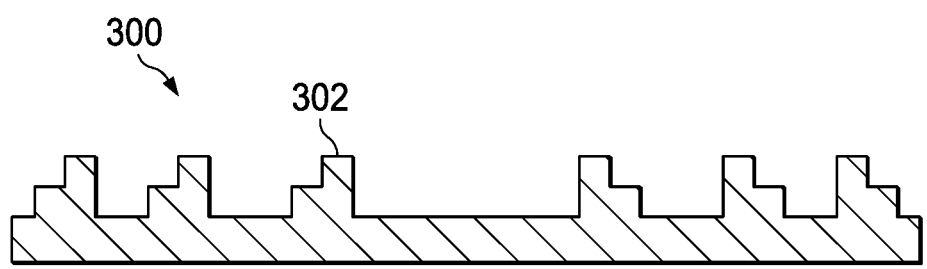
FIG. 3 is a side cross-section view of yet another example Fresnel electrode that may be used to implement the example acoustic wave resonator of FIG. 1.

FIG. 3 is a side cross-section view of yet another example Fresnel electrode 300, in accordance with this disclosure. In the example FIG. 3, the features 120 having the sloped surfaces 122 are replaced with stair-stepped shapes (one of which is designated at reference numeral 302). Like FIG. 1, the features 302 of FIG. 3 are spaced apart by steadily changing separations. However, the features 302 may be arranged in other ways, and/or may have other dimensions. Combinations of different shapes, dimensions and/or spacing can be used.

Figure 4:
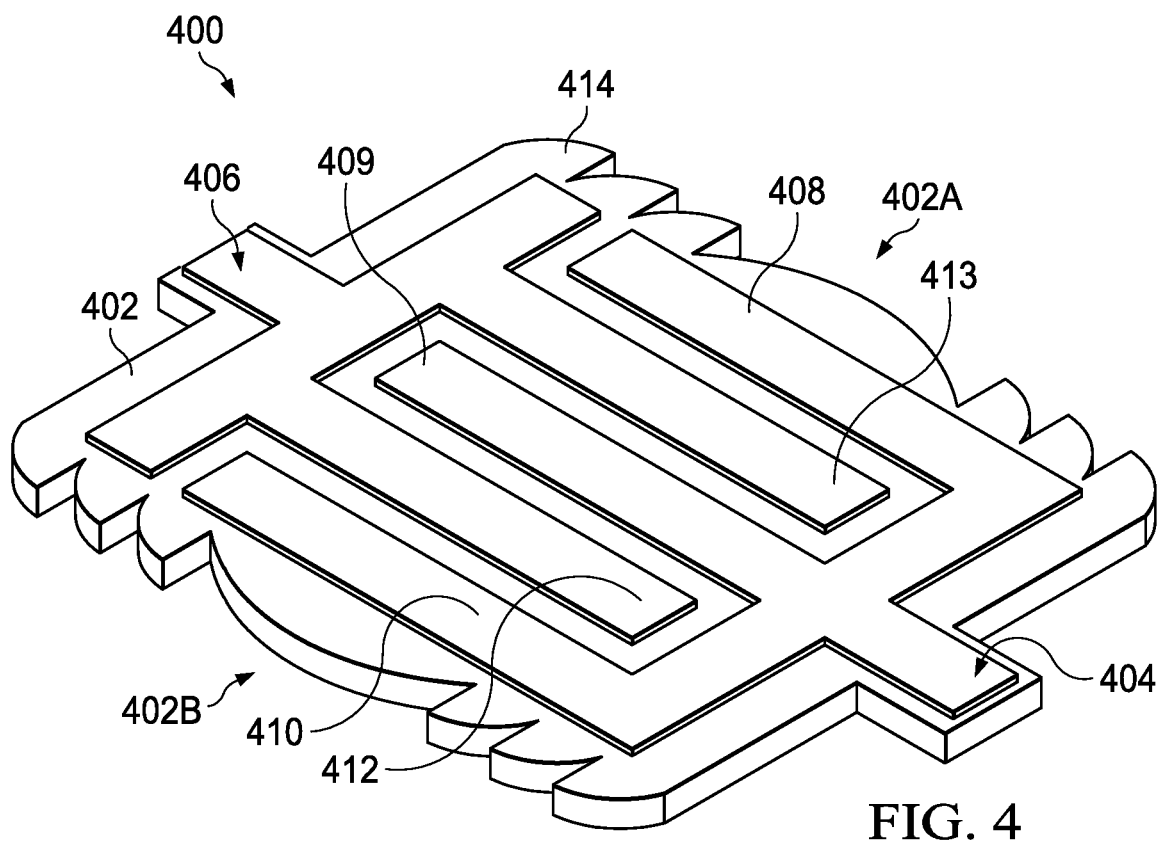
FIG. 4 is a top perspective view of an example plane acoustic wave (PAW, a.k.a. contour mode or Lamb wave) resonator having piezoelectric material with Fresnel features on the edges, constructed according to this disclosure.

FIG. 4 is a top perspective view of an example PAW resonator (or a Lamb wave resonator, a contour mode resonator, etc.) 400 having an example Fresnel piezoelectric layer 402, and electrodes 404 and 406. The Fresnel piezoelectric layer 402 includes example Fresnel surfaces on opposite edges 402A and 402B of piezoelectric layer 402. The example electrode 404 is a comb-shaped electrode or inter digital transducer (IDT) having one or more fingers 408-410. The example electrode 406 is a comb-shaped electrode or IDT having one or more fingers 412-413. The example fingers 408-410 are interlaced with the example fingers 412-413. In operation, when a voltage is applied between the electrode 404 and the electrode 406, plane acoustic waves (or Lamb waves, etc.) are generated in the piezoelectric material 402, which may, for example, be used to generate a clock signal, a carrier signal, etc.

To increase retention of acoustic energy in the acoustic resonator 400, the example piezoelectric layer 402 is patterned, on the edges 401A and 401B, to have a plurality of spaced-apart, recessed, protruding or raised example features, one of which is designated at reference numeral 414. The example features 414 are similar to, and operate similar to those discussed above in connections with FIGS. 1-3. Thus, the interested reader is referred to the disclosure provided above in connection with FIGS. 1-3 for a full description of the features 414.

While an example manner of implementing the PAW (or contour mode, or Lamb wave) resonator 400 having Fresnel surfaces 414 in accordance with this disclosure is illustrated in FIG. 4, one or more of the parts illustrated in FIG. 4 may be combined, divided, re-arranged, omitted, eliminated and/or implemented in any other way. Further, a PAW (or contour mode, or Lamb wave) resonator having Fresnel surfaces in accordance with this disclosure may include one or more parts in addition to, and/or instead of, those illustrated in FIG. 4, and/or may include more than one of any or all of the illustrated parts. For example, tethers or connections can be included.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Conjunctions such as "and," "or," and "and/or" are inclusive unless the context clearly dictates otherwise. For example, "A and/or B" includes A alone, B alone, and A with B. In this specification and the appended claims, the singular forms "a," "an" and "the" do not exclude the plural reference unless the context clearly dictates otherwise.

Any references, including publications, patent applications, and patents, cited herein are hereby incorporated by reference to the same extent as if each reference were individually and specifically indicated to be incorporated by reference and were set forth in its entirety herein.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit package, comprising:
an acoustic wave resonator including: a piezoelectric material having an edge, the edge including a Fresnel surface; a first electrode having a first one or more fingers on the piezoelectric material; and a second electrode having a second one or more fingers on the piezoelectric material, the second one or more fingers interlaced with the first one or more fingers.

2. The integrated circuit package of claim 1, wherein the piezoelectric material has a central portion, and the Fresnel surface includes protruding features that confine main mode acoustic energy in the central portion.

3. The integrated circuit package of claim 2, wherein distances between the protruding features change across the Fresnel surface.

4. The integrated circuit package of claim 2, wherein at least one of the protruding features has at least one of a sloped surface, a rectangular shape, or a stair-stepped shape.

5. The integrated circuit package of claim 1, further comprising an integrated circuit electrically coupled to the acoustic wave resonator.

6. An acoustic wave resonator, comprising:
a piezoelectric material having a central portion and first and second edges, the first and second edges having protruding features that confine main mode acoustic energy from different portions of the piezoelectric material in the central portion;
a first electrode having a first one or more fingers on the piezoelectric material; and
a second electrode having a second one or more fingers on the piezoelectric material, the second one or more fingers interlaced with the first one or more fingers.

7. The acoustic wave resonator of claim 6, wherein distances between the protruding features change across the first edge.

8. The acoustic wave resonator of claim 6, wherein at least one of the protruding features has at least one of a curved edge, a straight edge, a triangular shape, a rectangular shape, or a stair-stepped shape.

9. The acoustic wave resonator of claim 6, wherein the protruding features are patterned by a semiconductor fabrication process.

* * * * *